United States Patent
Poelzl

(10) Patent No.: US 9,257,532 B2
(45) Date of Patent: *Feb. 9, 2016

(54) METHOD FOR FORMING A SEMICONDUCTOR DEVICE WITH A TRENCH AND AN ISOLATION

(71) Applicant: Infineon Technologies AG, Nuebiberg (DE)

(72) Inventor: Martin Poelzl, Ossiach (AT)

(73) Assignee: Infineon Technologies AG, Nuebiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/132,008

(22) Filed: Dec. 18, 2013

(65) Prior Publication Data

US 2014/0106555 A1 Apr. 17, 2014

Related U.S. Application Data

(63) Continuation of application No. 12/200,509, filed on Aug. 28, 2008, now Pat. No. 8,642,459.

(51) Int. Cl.

| H01L 21/3205 | (2006.01) |
|---|---|
| H01L 29/66 | (2006.01) |
| H01L 29/78 | (2006.01) |
| H01L 21/28 | (2006.01) |
| H01L 29/40 | (2006.01) |
| H01L 29/417 | (2006.01) |

(52) U.S. Cl.
CPC .... *H01L 29/66666* (2013.01); *H01L 21/28035* (2013.01); *H01L 29/66734* (2013.01); *H01L 29/7813* (2013.01); *H01L 29/407* (2013.01); *H01L 29/41766* (2013.01)

(58) Field of Classification Search
CPC ............ H01L 29/407; H01L 29/41766; H01L 29/66734; H01L 29/7813; H01L 21/28035; H01L 29/66666
USPC ........................... 438/595, 258; 257/E21.294
See application file for complete search history.

(56) References Cited

U.S. PATENT DOCUMENTS

| 6,110,799 A | 8/2000 | Huang |
|---|---|---|
| 6,291,298 B1 | 9/2001 | Williams et al. |
| 6,677,641 B2 | 1/2004 | Kocon |
| 6,852,590 B1 | 2/2005 | Tsai et al. |

(Continued)

OTHER PUBLICATIONS

Office Action mailed Oct. 14, 2010 in U.S. Appl. No. 12/200,509.

(Continued)

*Primary Examiner* — Duy T Nguyen
(74) *Attorney, Agent, or Firm* — Dicke, Billig & Czaja, PLLC

(57) ABSTRACT

A method for forming a semiconductor device. One embodiment provides a semiconductor substrate having a trench with a sidewall isolation. The sidewall isolation is removed in a portion of the trench. A gate dielectric is formed on the laid open sidewall. A gate electrode is formed adjacent to the date dielectric. The upper surface of the gate electrode is located at a depth $d1$ below the surface of the semiconductor substrate. The gate oxide is removed above the gate electrode. An isolation is formed simultaneously on the gate electrode and the semiconductor substrate such that the absolute value of height difference $d2$ between the isolation over the gate electrode and the isolation over the semiconductor substrate is smaller than the depth $d1$.

23 Claims, 8 Drawing Sheets

(56) References Cited

U.S. PATENT DOCUMENTS

| | | | |
|---|---|---|---|
| 2001/0028084 A1* | 10/2001 | Mo | 257/330 |
| 2004/0183136 A1 | 9/2004 | Williams et al. | |
| 2005/0145936 A1 | 7/2005 | Polzl et al. | |
| 2005/0242392 A1* | 11/2005 | Pattanayak et al. | 257/328 |
| 2005/0266648 A1 | 12/2005 | Chung et al. | |
| 2006/0273351 A1* | 12/2006 | Ozoe | H01L 21/2855 257/220 |
| 2007/0190728 A1 | 8/2007 | Sreekantham et al. | |

OTHER PUBLICATIONS

Final Office Action mailed Feb. 22, 2011 in U.S. Appl. No. 12/200,509.

Office Action mailed May 18, 2012 in U.S. Appl. No. 12/200,509.

Final Office Action mailed Oct. 2, 2012 in U.S. Appl. No. 12/200,509.

Notice of Allowance mailed Sep. 24, 2013 in U.S. Appl. No. 12/200,509.

* cited by examiner

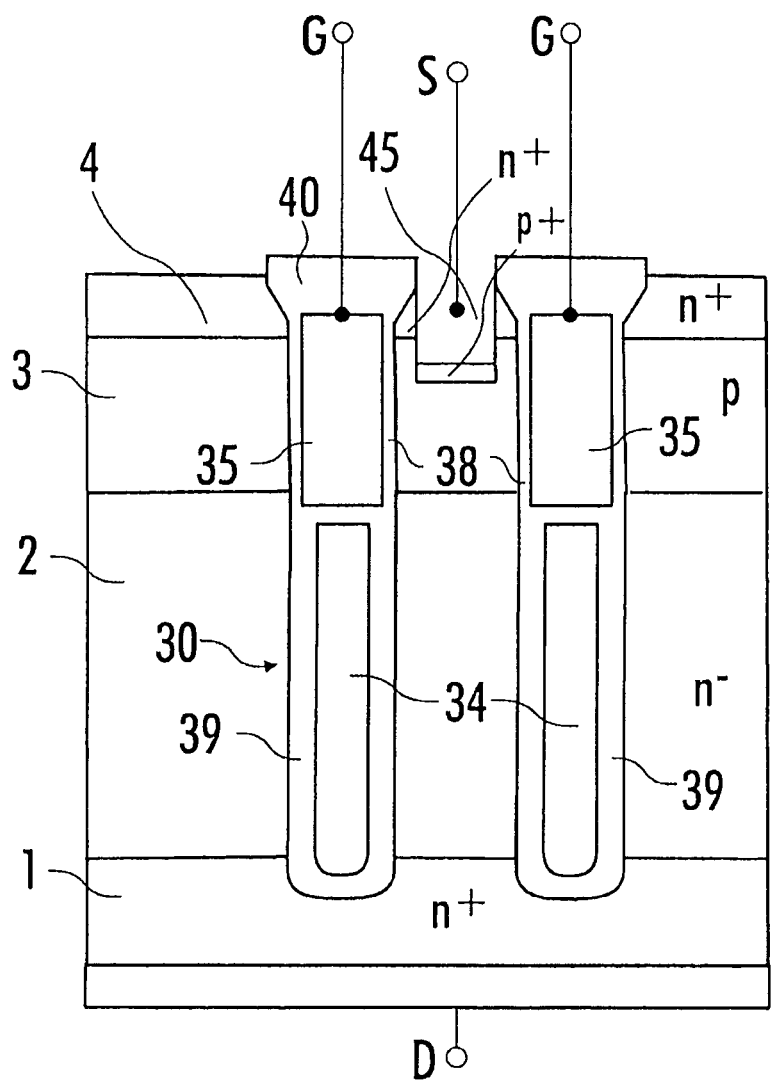

METHOD FOR FORMING A SEMICONDUCTOR DEVICE WITH A TRENCH AND AN ISOLATION

CROSS-REFERENCE TO RELATED APPLICATIONS

This Utility Patent Application is a Continuation application of U.S. Ser. No. 12/200,509, filed Aug. 28, 2008, now U.S. Pat. No. 8,642,459, which is incorporated herein by reference.

BACKGROUND

An important goal in the development of new methods for forming semiconductor devices is to reduce process deviations and to improve the reliability of the semiconductor device.

For these and other reasons, there is a need for the present invention.

SUMMARY

According to one embodiment of the present description a method for manufacturing a semiconductor device is provided which includes providing a semiconductor substrate having a trench with a sidewall isolation, removing the sidewall isolation in a portion of the trench, and forming a gate dielectric on the laid open sidewall. A gate electrode is formed adjacent to the date dielectric, the upper surface of the gate electrode being located at a depth d1 below the surface of the semiconductor substrate, removing the gate oxide above the gate electrode. An isolation is formed simultaneously on the gate electrode and the semiconductor substrate such that the absolute value of height difference d2 between the isolation over the gate electrode and the isolation over the semiconductor substrate is smaller than the depth d1.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4 illustrates a cross section of a vertical power transistor formed according to a method according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A number of embodiments will be explained below. In this case, identical structural features are identified by identical reference symbols in the figures. In the context of the present description, "lateral" or "lateral direction" should be understood to mean a direction or extent that runs parallel to the lateral extent of a semiconductor material or semiconductor body. A semiconductor body is typically present as a thin wafer or chip and includes two areas situated on opposite sides, one area of which is designated as main area. The lateral direction thus extends parallel to these surfaces. In contrast thereto, the term "vertical" or "vertical direction" is understood to mean a direction that runs perpendicular to the main area and thus to the lateral direction. The vertical direction therefore runs in the thickness direction of the wafer or chip.

The embodiments are described on the basis of n-channel vertical transistors. However, the embodiments are not restricted thereto and can also be formed as p-channel vertical transistors.

The structures illustrated in the figures are not depicted true to scale but rather serve only for the better understanding of the embodiments.

Figure 1:
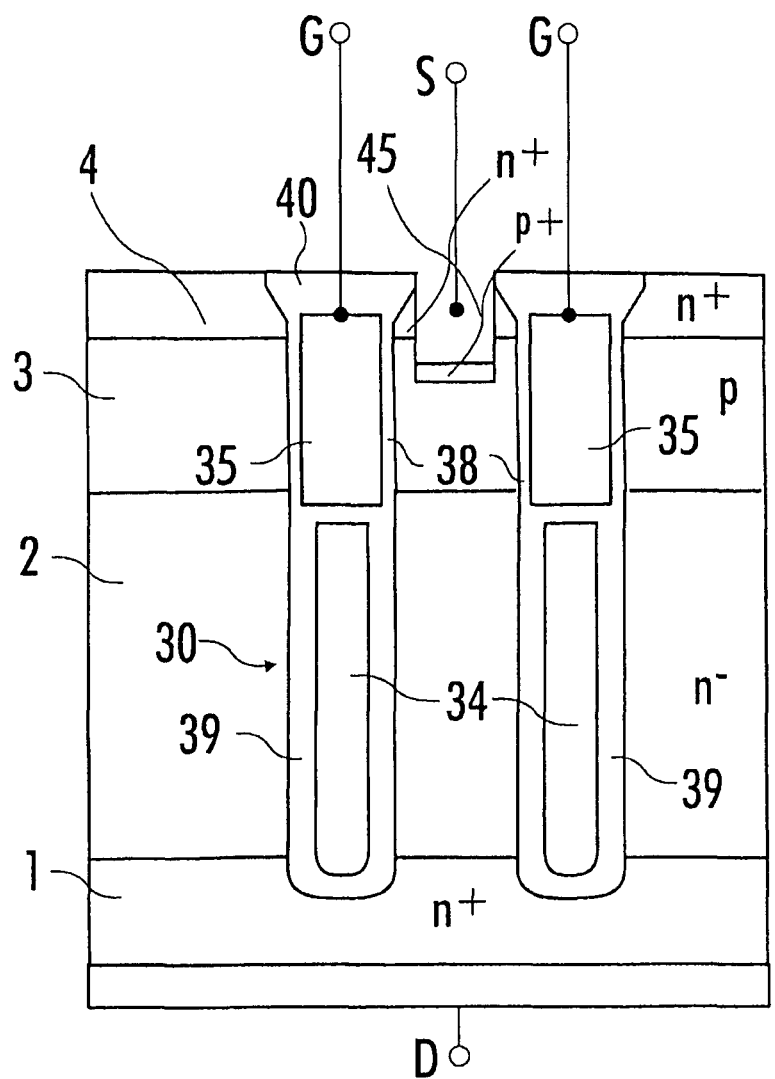
FIG. 1 illustrates a cross section of a vertical power transistor formed according to a method according to one embodiment.

FIG. 1 illustrates, on the basis of a vertical field effect power transistor, a semiconductor component having a semiconductor body having a first semiconductor region 1, a second semiconductor region 2 and a third semiconductor region 3. The first and second semiconductor regions 1 and 2 are of the first conduction type and n-conducting in the present case. By contrast, the third semiconductor region 3 is of the second conduction type, which is complementary to the first conduction type, and p-conducting in the present case.

In the present embodiment, the semiconductor body includes silicon. Other materials such as, for example, silicon carbide (SiC) or compound semiconductors are likewise suitable.

Within the semiconductor body trenches 30 are provided which include a sidewall isolation 39 including an isolating material, silicon oxide in this example. Furthermore, a field electrode 34 is arranged in a lower portion of the trenches 30, the field electrode 34 being insulated from the semiconductor body and the semiconductor regions formed therein by the sidewall isolation 39. Thus, in the region of the second semiconductor region 2, the sidewall isolation 39 performs the function of a field oxide. The sidewall isolation 39 may include one material or material combinations. An insulating oxide, for example, silicon oxide is typically used. However, different materials may also be used for producing sidewall isolation 39. The sidewall isolation 39 may also grow very slowly in its thickness, as seen in the vertical direction, so that the complete thickness is reached only in the region of the trench bottom.

In an upper portion of the trench 30 a gate dielectric 38 next to the third semiconductor region 3 is provided. Adjacent to the dielectric 38 the gate electrode 35 is provided. On top of the gate electrode 35 a first isolation 40 is located.

An n$^+$-doped fourth semiconductor region 4 is arranged in the semiconductor body, the fourth semiconductor region being spaced apart from the second semiconductor region 2. The fourth semiconductor region 4 is typically situated at an upper surface of the semiconductor body, reaches laterally as far as the trench structures 30 and typically forms the source region (source zone) of the power transistor.

The third semiconductor region 3 is typically referred to as body region. By contrast, the semiconductor region 2 constitutes a drift path (drift zone) between the body region 3 and the first semiconductor region 1, which is referred to as the substrate or drain region (drain zone). A channel is formed in the third semiconductor region or body region 3 when a suitable voltage is applied to the gate electrode 35.

A contact hole 45 is likewise formed at the upper surface of the semiconductor body between the trenches 30. The contact hole is filled with a conductive material (not illustrated), in order to contact the source region and the body region of the power transistor. An associated source terminal S is illustrated in FIG. 1.

The gate electrode 35 is contact-connected via a gate terminal G. A rear side contact is situated on a rear side (lower surface) of the semiconductor body and constitutes a drain-side contact-connection connected to a drain terminal D.

The semiconductor device according to FIG. 1 includes a gate electrode 35 that is separated from the field electrode 34 by an isolation layer. However, in a further embodiment the gate electrode 35 and the field electrode 34 might also be connected or the field electrode 34 might not be present at all. In the example of FIG. 1 two trenches 30 and one contact hole 45 are illustrated. However, in a further embodiment more than two trenches 30 and more than one contact hole 45 might be present.

FIGS. 2a to 2e describe a method for producing a semiconductor device according to one embodiment of the present description. Firstly, provision is made of a semiconductor basic body composed, for example, of highly n-doped monocrystalline silicon, which subsequently forms the first semiconductor region 1. An epitaxial layer (semiconductor layer) composed of silicon, for example, is grown onto the semiconductor basic body. The second and third semiconductor region 2, 3 and also the fourth and fifth semiconductor region are subsequently formed in the epitaxial layer. During the deposition of the epitaxial layer or by using suitable subsequent measures, a predetermined doping profile is formed in the epitaxial layer.

Figure 2A:
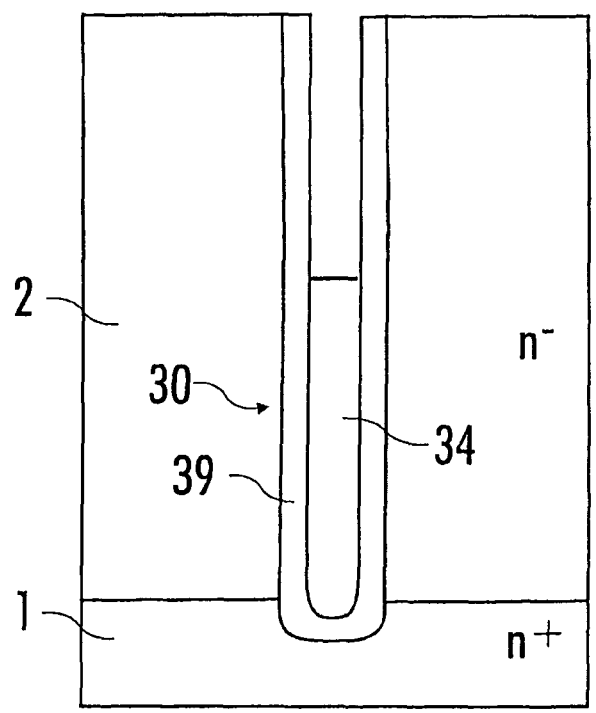
FIGS. 2a to 2e illustrate a method for manufacturing a semiconductor device according to one embodiment.
Figure 2B:
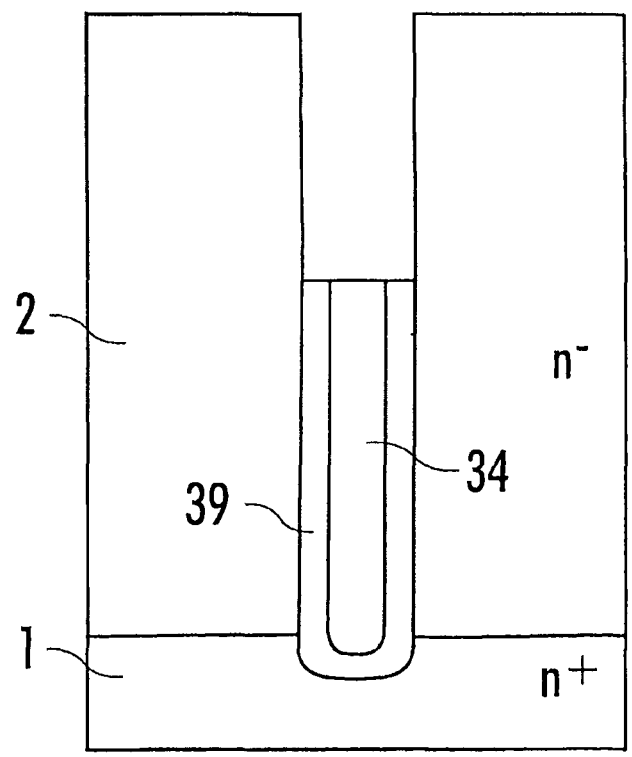

A trench 30 is subsequently introduced into the substrate wafer (semiconductor body) by using anisotropic or isotropic etching, and a process involves for example thermal oxidation of a thick field oxide 39 in the trenches 30. This is followed by the production of the poly silicon field plate 34 in the trenches 30. The resulting semiconductor is illustrated in FIG. 2a.

Figure 2C:
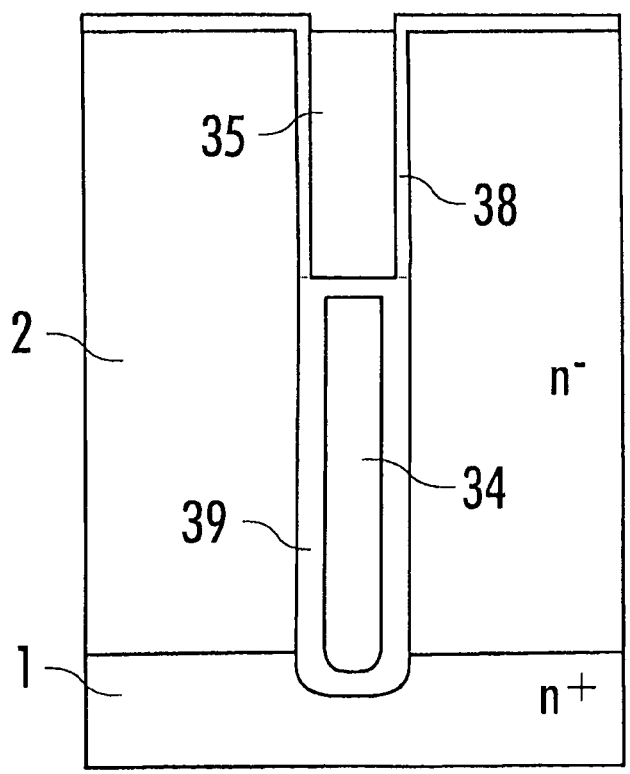

In the following the sidewall isolation in an upper portion of the trench is locally removed by etching (see FIG. 2b) and a gate dielectric 38 is formed on the laid open sidewall by an oxidation process. Furthermore, an isolation layer on top the field electrode 34 is formed. By using a further deposition process followed by a chemical mechanical polishing process (CMP) the poly silicon gate electrode 35 is formed adjacent to the gate dielectric 38. The resulting semiconductor is illustrated in FIG. 2c.

In the following the fourth semiconductor region 4 is formed by implantation in the epitaxial layer followed by a thermal treatment to activate the dopand atoms. This thermal treatment may also be performed at a later stage, for example in connection with other thermal processes (thermal oxidation).

Figure 2D:
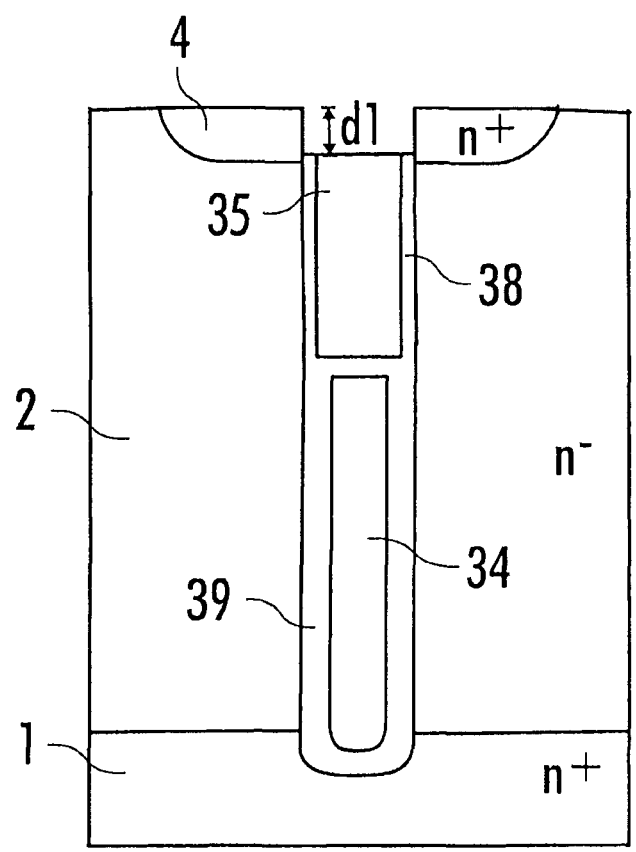

A shallow recess process is then performed such that the upper surface of the gate electrode 35 is located at a depth d1 below the surface of the semiconductor substrate. An additional implantation process is performed, especially an As implantation process is performed, in order to provide a higher doping concentration on the upper surface of the gate electrode 35. According to one embodiment the energy of the dopand atoms lies in the range between 20 and 60 keV and the dose of the implantation lies in the range between $5*10^{14}$ and $5*10^{16}$ cm$^{-2}$. According to a further embodiment the dose of the implantation lies in the range between $5*10^{15}$ and $1*10^{16}$ cm$^{-2}$. Thereafter, the gate dielectric 38 above the gate electrode 35 is removed. The resulting situation is illustrated in FIG. 2d.

In order to form the first isolation layer 40 a thermal oxidation process is performed. Thereby the growth rate of silicon oxide on the poly silicon of the gate electrode is higher than the growth rate of silicon oxide on the surface of silicon substrate. Accordingly, an isolation is simultaneously formed on the gate electrode 35 and the semiconductor substrate. According to one embodiment a flow of oxygen (O$_2$) in the range between 15000 and 25000 ccm/min is used. According to a further embodiment the amount of hydrogen (H$_2$) is less than 1% of the amount of oxygen. The thermal oxidation is stopped such that the absolute value of height difference d2 between the isolation over the gate electrode and the isolation over the semiconductor substrate, measured with regard to the surface of the isolation, is smaller than the depth d1. According to one embodiment the thickness of the isolation over the gate electrode is larger than the sum of the thickness of the isolation over the semiconductor substrate and d1.

Thereafter a second isolation 43 may be formed by depositing, for example an undoped silicate glass layer (USG), a phosphorus-doped silicate glass layer (PSG), a BPSG layer (Borophosphosilicate glass) or a nitride layer, on top of the first isolation 40. The resulting situation is illustrated in FIG. 2e.

Figure 2E:
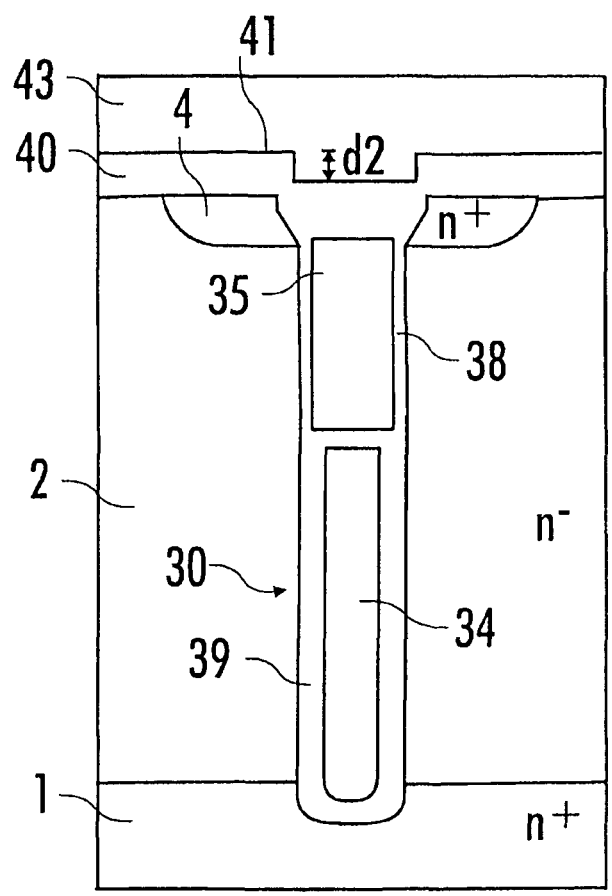

In the embodiment illustrated in FIG. 2e the process parameters of the thermal oxidation process were chosen such that the first isolation 40 over the semiconductor substrate is thicker than the isolation over the gate electrode 35. However, as can be seen from FIG. 3, process parameters of the thermal oxidation process may also be chosen in a manner such that the first isolation 40 over the semiconductor substrate is thinner than the isolation over the gate electrode 35. In this case an additional, second isolation may be omitted.

Even though the first isolation 40 is formed on an underground that exhibits considerable height differences the surface 41 of the first isolation layer 40 exhibits a high degree parallelism to the surface of the semiconductor substrate. Furthermore, the first isolation layer 40 is comparatively thin and exhibits only minor thickness deviations across the semiconductor substrate and from one semiconductor wafer to another semiconductor wafer. This allows for a reduced depth of the source region 4 and reduced depth d1 of the upper surface gate electrode 35 below the surface of the semiconductor substrate.

In the following process the isolation layers 40 and 43 are removed from the upper surface of the substrate, for example by performing a chemical mechanical polishing process and/ or an etching process. Thereby, those portions of the layer 40, that are situated within the trench 30 remain within the trench 30, in order to form an isolation for the gate electrode 35.

Thereafter, a contact hole 45 is formed in the semiconductor substrate located between the trenches 30 (FIG. 1), using a self-adjusted, anisotropic etching process. Later on the contact hole is filled with a conductive material (not illustrated), in order to contact the source region 4 and the body regions 5. During the etching process the isolation above the gate electrode 35 serves as a mask for forming the contact hole 45. By using the isolation above the gate electrode 35 as a mask the position of the contact hole relative to the trenches 30 can be adjusted with high precision.

Furthermore, the isolation above the gate electrode 35 serves as a mask for an additional p$^+$ implantation process, in order to provide an p$^+$ contact area to the body region 3 of the transistor.

Figure 3:
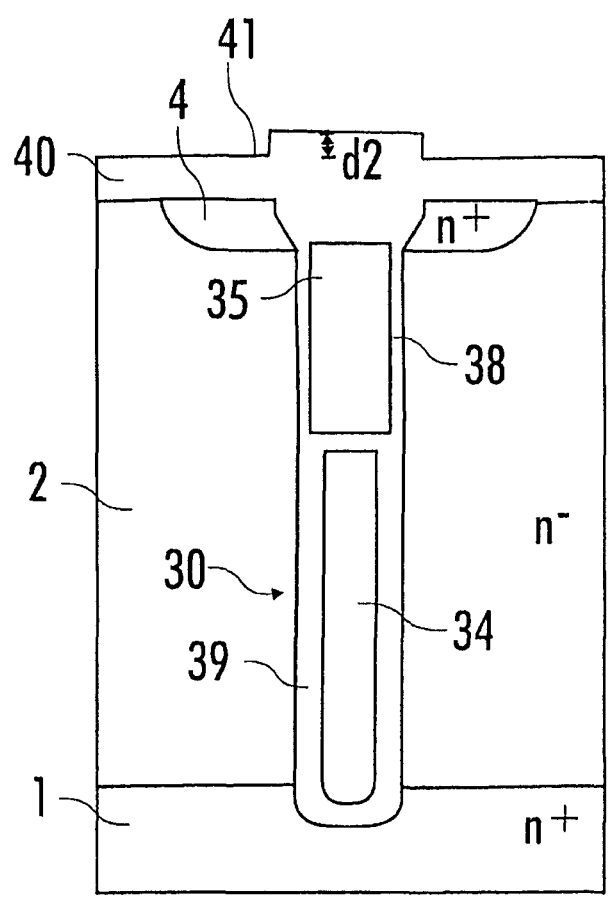
FIG. 3 illustrates a method for manufacturing a semiconductor device according to one embodiment.

Instead of performing a chemical mechanical polishing process in order to remove the isolation layer 40 from the upper surface of the substrate, an anisotropic etching process may also be employed, especially in a situation as illustrated in FIG. 3. Once the surface of the semiconductor substrate is reached the anisotropic etching process is stopped and a further anisotropic etching process is performed, in order to form the contact hole 45. This further anisotropic etching process is chosen to etch primarily the material of semiconductor substrate rather than the material of the isolation 40. In this manner the isolation above the gate electrode 35 serves as a mask for forming the contact hole 45. The resulting situation is illustrated in FIG. 4.

In contrast to situation illustrated in FIG. 1, where the surface of the isolation over the gate electrode 35 is on the same level as the surface of the surrounding semiconductor substrate, in FIG. 4 the surface of the isolation over the gate electrode 35 is considerably higher than the surface of the surrounding semiconductor substrate.

After providing the usual contacts and isolations the substrate wafer is subsequently applied by its top side to a carrier (not illustrated) in a releasable manner. This serves to stabilize the substrate wafer during the subsequent mechanical grinding and etching of the rear side. In a further embodiment the thinning of the wafer may also be achieved without the use of an additional carrier. The substrate wafer may be thinned by using a CMP method, for example, wherein the bottom of the trenches 30 may serve as a grinding stop. Typically, however, the thinning is already stopped prior to uncovering the bottom, in order that semiconductor material still remains below the trenches 30. After thinning the substrate wafer may have a thickness of between approximately 30 μm and 250 μm.

Thus a method for manufacturing a semiconductor device is provided which includes providing a semiconductor substrate having a trench with a sidewall isolation, removing the sidewall isolation in a portion of the trench, forming a gate dielectric on the laid open sidewall, forming a gate electrode adjacent to the date dielectric, the upper surface of the gate electrode being located at a depth d1 below the surface of the semiconductor substrate, removing the gate oxide above the gate electrode, and forming an isolation simultaneously on the gate electrode and the semiconductor substrate such that the absolute value of height difference d2 between the isolation over the gate electrode and the isolation over the semiconductor substrate is smaller than the depth d1. According to one embodiment the processes are performed in the given sequence.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a semiconductor device, comprising:
   providing a semiconductor substrate having a trench with a sidewall isolation;
   removing the sidewall isolation in a portion of the trench;
   forming a gate dielectric on the laid open sidewall in the portion of the trench;
   forming a gate electrode adjacent to the gate dielectric, an upper surface of the gate electrode being located at a depth dl below the surface of the semiconductor substrate such that the gate dielectric is exposed in an upper portion of the trench, wherein the gate electrode comprises doped polysilicon;
   performing an implantation after the formation of the gate electrode to provide the upper surface of the gate electrode with a higher doping concentration;
   removing, subsequent to forming the gate electrode and subsequent to performing the implantation, the gate dielectric above the gate electrode; and
   forming, subsequent to removing the gate dielectric, an isolation simultaneously on the gate electrode and the semiconductor substrate such that an absolute value of height difference d2 between the isolation over the gate electrode and the isolation over the semiconductor substrate is smaller than the depth d1.

2. The method of claim 1, wherein forming the gate electrode comprises performing a shallow recess process such that the gate dielectric is exposed in the upper portion of the trench.

3. The method of claim 1, comprising wherein the energy of the dopand atoms lies in the range between 20 and 60 keV.

4. The method of claim 1, comprising wherein the dose of the implantation lies in the range between $5*10^{14}$ and $5*10^{16}$ cm$^{-2}$.

5. The method of claim 4, comprising wherein the dose of the implantation lies in the range between $5*10^{15}$ and $1*10^{16}$ cm$^{-2}$.

6. The method of claim 1, wherein semiconductor substrate comprises silicon.

7. The method of claim 1, wherein the sidewall isolation comprises silicon oxide.

8. The method of claim 1, wherein the isolation comprises silicon oxide.

9. The method of claim 1, comprising forming the isolation in a single step.

10. The method of claim 1, comprising forming the gate electrode by deposition followed by chemical mechanical polishing.

11. The method of claim 1, comprising removing a portion of the isolation and thereafter performing implantation defining the conduction type of the semiconductor region adjacent to the gate dielectric.

12. The method of claim 1, wherein the thickness of the isolation over the gate electrode is larger than the sum of the thickness of the isolation over the semiconductor substrate and d1.

13. The method of claim 1, comprising uncovering at least a portion of surface of the semiconductor substrate from the isolation and forming at least one contact hole in the uncovered portion of semiconductor substrate.

14. The method of claim 13, comprising using the isolation over the gate electrode as a mask for the formation of the contact hole.

15. A method for manufacturing a semiconductor device, comprising:
   providing a semiconductor substrate having a trench with a sidewall isolation;
   removing the sidewall isolation in a portion of the trench;
   forming a gate dielectric on the laid open sidewall in the portion of the trench;
   forming a gate electrode adjacent to the gate dielectric, an upper surface of the gate electrode being located at a depth d1 below the surface of the semiconductor substrate such that the gate dielectric is exposed in an upper portion of the trench, wherein the gate electrode comprises doped polysilicon;
   performing an implantation after the formation of the gate electrode to provide the upper surface of the gate electrode with a higher doping concentration;
   removing, subsequent to forming the gate electrode and subsequent to performing the implantation, the gate dielectric above the gate electrode; and
   forming, subsequent to removing the gate dielectric, an isolation by thermal oxidation, simultaneously on the gate electrode and the semiconductor substrate such that an absolute value of height difference d2 between the isolation over the gate electrode and the isolation over the semiconductor substrate is smaller than the depth d1.

16. The method of claim 15, wherein the temperature of the thermal oxidation process is higher than 900° C.

17. The method of claim 15, wherein the temperature of the thermal oxidation process is lower than 1100° C.

18. The method of claim 15, comprising performing the thermal oxidation process over period of 200 min to 280 min.

19. A method for manufacturing a semiconductor device, comprising:
   providing a semiconductor substrate having a trench with a sidewall isolation;
   removing the sidewall isolation in a portion of the trench;
   forming a gate dielectric on the laid open sidewall in the portion of the trench;
   forming a gate electrode adjacent to the gate dielectric, an upper surface of the gate electrode being located at a depth d1 below the surface of the semiconductor substrate wherein the gate electrode comprises doped polysilicon;
   performing an implantation after the formation of the gate electrode to provide the upper surface of the gate electrode with a higher doping concentration;
   removing, subsequent to forming the gate electrode and subsequent to performing the implantation, the gate dielectric above the gate electrode;
   forming, subsequent to removing the gate dielectric, a first isolation simultaneously on the gate electrode and the semiconductor substrate such that an absolute value of height difference d2 between the isolation over the gate electrode and the isolation over the semiconductor substrate is smaller than the depth d1; and
   forming a second isolation on the first isolation.

20. The method of claim 19, comprising forming the second isolation as a silicate glass layer.

21. The method of claim 19, comprising forming the second isolation as an undoped silicate glass layer.

22. A method for manufacturing a semiconductor device, comprising:
   providing a semiconductor substrate;
   removing a sidewall isolation in a portion of a trench in the semiconductor substrate;
   forming a gate dielectric on the sidewall in the portion or the trench;
   forming a gate electrode adjacent to the gate dielectric, and performing subsequently a shallow recess process such that an upper surface of the gate electrode is located at a depth d1 below the surface of the semiconductor substrate, wherein the gate electrode comprises doped polysilicon;
   performing an implantation after the formation of the gate electrode to provide the upper surface of the gate electrode with a higher doping concentration;
   removing, subsequent to forming the gate electrode and subsequent to performing the implantation, the gate dielectric above the gate electrode including an exposed portion of the gate dielectric in an upper portion of the trench; and
   forming a isolation on the gate electrode and the semiconductor substrate such that an absolute value of height difference d2 between the isolation over the gate electrode and the isolation over the semiconductor substrate is smaller than the depth d1.

23. The method of claim 22, comprising:
   uncovering at least a portion of surface of the semiconductor substrate and forming at least one contact hole in the uncovered portion of semiconductor substrate; and
   using the isolation over the gate electrode as a mask for the formation of the contact hole.

* * * * *